United States Patent
Ramagopal et al.

(10) Patent No.: US 6,963,962 B2
(45) Date of Patent: Nov. 8, 2005

(54) MEMORY SYSTEM FOR SUPPORTING MULTIPLE PARALLEL ACCESSES AT VERY HIGH FREQUENCIES

(75) Inventors: Hebbalalu S. Ramagopal, Austin, TX (US); Murali S. Chinnakonda, Austin, TX (US); Thang M. Tran, Austin, TX (US)

(73) Assignee: Analog Devices, Inc., Norwood, MA (US)

( * ) Notice: Subject to any disclaimer, the term of this patent is extended or adjusted under 35 U.S.C. 154(b) by 352 days.

(21) Appl. No.: 10/120,686

(22) Filed: Apr. 11, 2002

(65) Prior Publication Data

US 2003/0196058 A1 Oct. 16, 2003

(51) Int. Cl.[7] .............................................. G06F 12/00
(52) U.S. Cl. ...................... 711/169; 711/140; 711/150; 711/151; 711/152; 711/158; 711/168; 711/210; 710/22; 710/39; 710/40; 709/102
(58) Field of Search ................................. 711/140, 150, 711/151, 152, 158, 168, 169, 210; 710/22, 39, 40; 709/102

(56) References Cited

U.S. PATENT DOCUMENTS

| | | | |
|---|---|---|---|
| 5,611,075 A | | 3/1997 | Garde |
| 5,822,341 A | * | 10/1998 | Winterrowd et al. ....... 714/795 |
| 5,896,543 A | | 4/1999 | Garde |
| 6,393,534 B1 | * | 5/2002 | Chen et al. ................. 711/158 |
| 6,430,642 B1 | * | 8/2002 | Stracovsky et al. ......... 710/244 |
| 6,430,654 B1 | * | 8/2002 | Mehrotra et al. ........... 711/118 |

* cited by examiner

Primary Examiner—Donald Sparks
Assistant Examiner—Bao Q Truong
(74) Attorney, Agent, or Firm—Wolf, Greenfield & Sacks, P.C.

(57) ABSTRACT

A memory system for operation with a processor, such as a digital signal processor, includes a high speed pipelined memory, a store buffer for holding store access requests from the processor, a load buffer for holding load access requests from the processor, and a memory control unit for processing access requests from the processor, from the store buffer and from the load buffer. The memory control unit may include prioritization logic for selecting access requests in accordance with a priority scheme and bank conflict logic for detecting and handling conflicts between access requests. The pipelined memory may be configured to output two load results per clock cycle at very high speed.

12 Claims, 9 Drawing Sheets

MEMORY SYSTEM FOR SUPPORTING MULTIPLE PARALLEL ACCESSES AT VERY HIGH FREQUENCIES

FIELD OF THE INVENTION

This invention relates to computer memory systems and, more particularly, to pipelined memory systems that support multiple accesses at very high frequencies. The memory systems are particularly useful in digital signal processing systems, but are not limited to such applications.

BACKGROUND OF THE INVENTION

A digital signal computer, or digital signal processor (DSP), is a special purpose computer that is designed to optimize performance for digital signal processing applications, such as, for example, fast Fourier transforms, digital filters, image processing, signal processing in wireless systems and speech recognition. Digital signal processor applications are typically characterized by real-time operation, high interrupt rates and intensive numeric computations. In addition, digital signal processor applications tend to be intensive in memory access operations and require the input and output of large quantities of data. Digital signal processor architectures are typically optimized for performing such computations efficiently.

Microcontrollers, by contrast, involve the handling of data but typically do not require extensive computation. Architectures that are optimized for DSP computations typically do not operate efficiently as microcontrollers, and microcontrollers typically do not perform well as digital signal processors. Nonetheless, applications frequently require both digital signal processor and microcontroller functionality.

The characteristics of microcontroller data access patterns include temporal and spatial locality, which is ideally found in a cache. Specifically, the latency of memory operations is important, and common instruction sequences, such as load-compare-branch, need to be executed with a short latency. Otherwise, the branch misprediction penalty is large. Pointer chasing, where a load is performed to a register and the load is subsequently used to form an address for another load (commonly referred to as load-to-load interlock or pointer chasing), also needs to be executed with a short latency. This is because the second load, whose address is dependent on the first load, stalls for a longer time. In an in-order processor, a stall stops the entire machine without any useful work being done. Therefore, a microcontroller demands a short pipeline memory architecture.

Digital signal processors perform repetitive computations on large data sets. These large data sets may be accessed only once in the form of a load-compute-store sequence where the load and store are executed many times and are to different addresses. Temporal locality doesn't apply to these data sets, since data is not being re-accessed. Spatial locality applies in a limited sense in that data access patterns tend to be non-sequential stride based. These features make caches non-optimal for DSP applications, since caches have the undesirable overhead of cache fills and copybacks. In a cache fill, the memory operation which produced a cache miss stalls the entire processor, waits for the data to come from memory and then the fill data is written to memory. In a typical example, four cycles may be required to write back 32 bytes of data, during which time that particular bank of memory is not available to the processor. A similar situation applies to copybacks. If data is rarely reused, i.e., poor temporal locality, then there is no advantage in bringing a line of memory into the cache in view of sparse spatial locality.

In one prior art approach, the cache is provided with SRAM capability. If the cache is programmed as SRAM, then there is no refill and copyback overhead. However, the SRAM size is very small compared to the large data set typically used in DSP computations. The burden of managing overlays, the swapping in and out of data from a larger SRAM using DMA, must be done by software. Getting to this work correctly in performance sensitive applications may be very difficult.

Digital signal processor designs may be optimized with respect to different operating parameters, such as computation speed, power consumption and ease of programming, depending on intended applications. Furthermore, digital signal processors may be designed for 16-bit words, 32-bit words, or other word sizes. A 32-bit architecture that uses a long instruction word and wide data buses and which achieves high operating speed is disclosed in U.S. Pat. No 5,954,811, issued Sep. 21, 1999 to Garde. The disclosed digital signal processor includes three memory banks, each having a capacity of 2 megabits, connected by respective data buses to dual computation blocks. Notwithstanding very high performance, the disclosed processor does not provide an optimum solution for all applications.

Memory latency is frequently a limiting factor in achieving enhanced processor performance. Because digital signal processor computations tend to be intensive in memory access operations, memory systems are critical components of high performance digital signal processors. Accordingly, there is a need for further innovations in memory systems for digital signal processors.

SUMMARY OF THE INVENTION

According to a first aspect of the invention, a memory system is provided for operation with a processor. The memory system comprises a high speed pipelined memory, a store buffer for holding store access requests from the processor, a load buffer for holding load access requests from the processor, prioritization logic for selecting access requests in accordance with a priority scheme, and bank conflict logic for detecting and handling conflicts between access requests.

The pipelined memory may comprise at least two independently accessible megabanks, each comprising at least two independently-accessible superbanks. In one embodiment, the pipelined memory comprises two independently-accessible megabanks, each comprising five independently-accessible superbanks. The pipelined memory is preferably configured to output two load results per clock cycle and more preferably is configured to output two load results and one DMA result per clock cycle.

The prioritization logic may be configured for receiving load access requests from the load buffer, load access requests from the processor and instruction access requests from the processor. The prioritization logic may be configured for receiving access requests from two or more processors.

The bank conflict logic may be configured for receiving selected access requests from the prioritization logic, store access requests from the store buffer and DMA access requests from a DMA requestor. The bank conflict logic may detect conflicts among the access requests and generate a stall signal in response to the conflicts.

According to a second aspect of the invention, a memory system is provided for operation with a processor. The memory system comprises a high speed memory, a load buffer for holding load access requests from the processor, and a memory control unit for processing access requests from the processor. The memory control unit places load access requests from the processor in the load buffer in response to a stall condition and processes the load access requests held in the load buffer in response to removal of the stall condition.

According to a third aspect of the invention, a memory system is provided for operation with a processor. The memory system comprises a high speed memory, a store buffer for holding store access requests from the processor, and a memory control unit. The memory control unit places the store access requests in the store buffer, detects conflicts between the store access requests and other types of access requests, and processes each store access request held in the store buffer in the absence of a conflict with another type of access request.

According to a fourth aspect of the invention, a memory system is provided for operation with first and second processors. The memory system comprises a high speed memory, first and second store buffers for holding store access requests from the first and second processors, respectively, first and second load buffers for holding load access requests from the first and second processors, respectively, and a memory control unit for processing access requests from the first and second processors, from the first and second store buffers and from the first and second load buffers.

The memory control unit may comprise prioritization logic for selecting access requests in accordance with a priority scheme, and bank conflict logic for detecting and handling conflicts between access requests. The memory control unit may be configured for placing load access requests from each of the processors in the respective load buffers in response to a stall condition and for processing the load access requests held in the respective load buffers in response to removal of the stall condition. The memory control unit may further be configured for placing the store access requests from the first and second processors in the first and second store buffers, respectively, and for processing each store access request held in the first and second store buffers in the absence of a conflict with another type of access request.

According to a fifth aspect of the invention, a method is provided for operating a high speed memory with a processor. The method comprises the steps of processing access requests from the processor and generating a stall signal in response to a specified stall condition, sending the stall signal to the processor, and placing load access requests from the processor in a load buffer in response to the stall signal. The method may further comprise the step of processing the load access request held in the load buffer in response to removal of the stall condition.

According to a sixth aspect of the invention, a method is provided for operating a high speed memory with a processor. The method comprises the steps of placing store access requests from the processor in a store buffer, detecting a conflict between a store access request and another type of access request, and processing each store access request held in the store buffer in the absence of a conflict with another type of access request.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
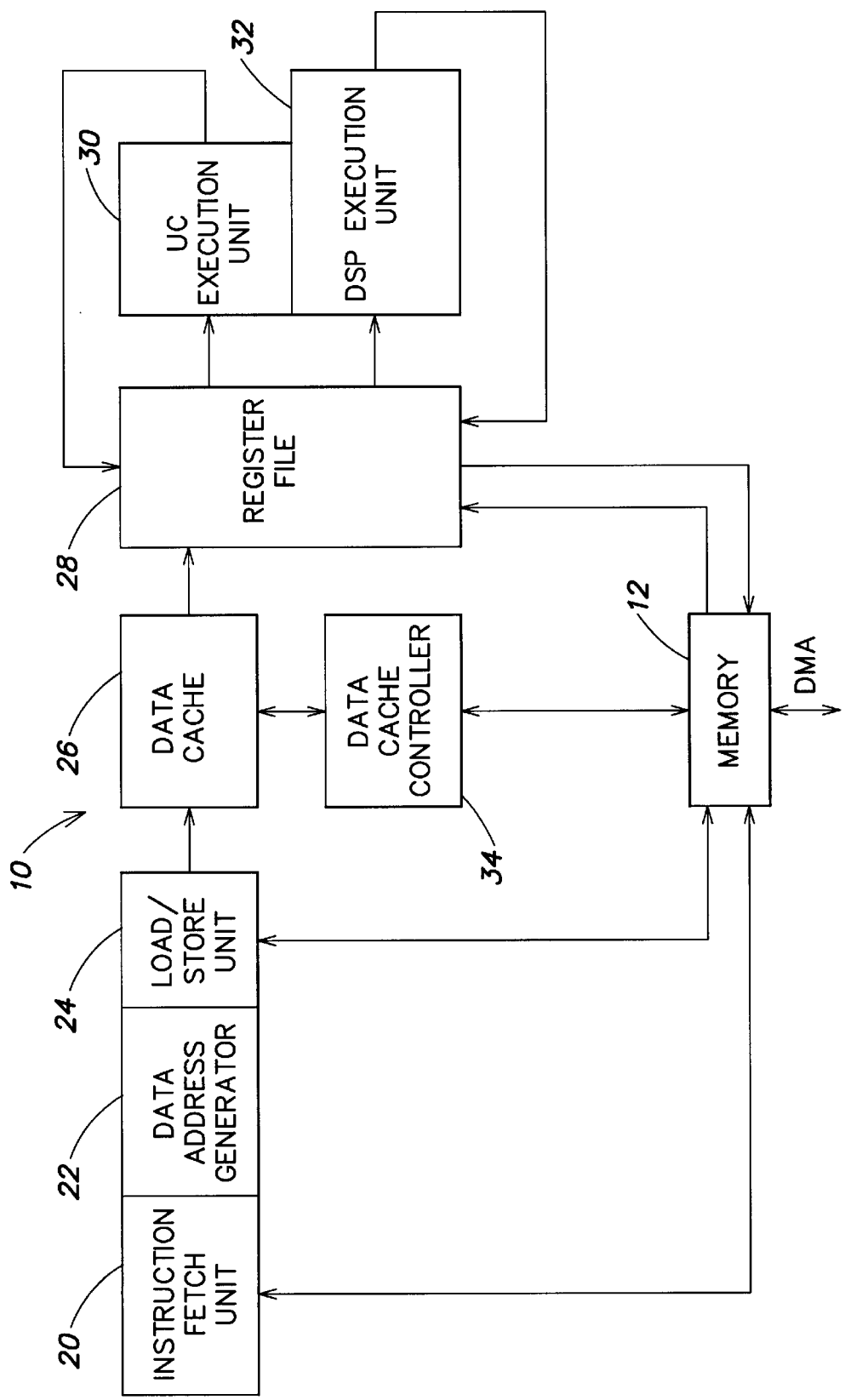
FIG. 1 is a block diagram of an embodiment of a digital signal processor suitable for incorporation of the invention.
Figure 2:
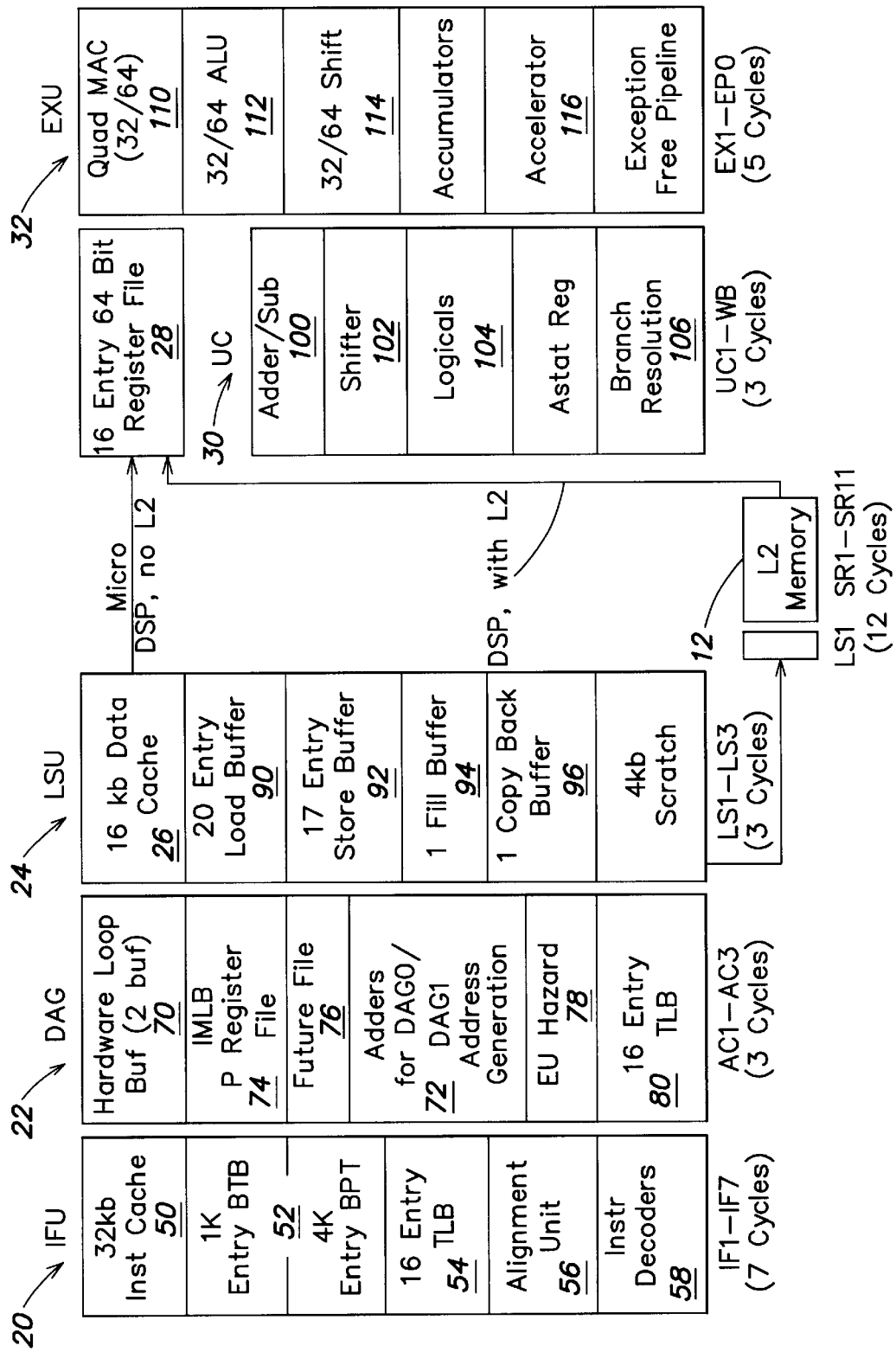
FIG. 2 is a block diagram of the digital signal processor of FIG. 1, showing major components of each pipeline unit.

A block diagram of an embodiment of a digital signal processor suitable for incorporation of the invention is shown in FIGS. 1 and 2. The digital signal processor includes a computation core 10 and a memory 12. The computation core 10 is the central processor of the DSP. Both the core 10 and the memory 12 are pipelined, as described below. Core 10 includes an instruction fetch unit 20, a data address generator 22, a load/store unit 24, a data cache 26, a register file 28, a microcontroller execution unit 30, a DSP execution unit 32 and a data cache controller 34.

Instruction fetch unit 20 may include a 32 k byte instruction cache 50, branch prediction circuitry 52, a TLB (translation look-aside buffer) 54, an instruction alignment unit 56 and an instruction decoder 58. In instruction fetch unit 20, program instructions are fetched from the instruction cache 50 and are decoded by the instruction decoder 58. In the event of an instruction cache miss, the requested instruction is accessed in memory 12. Instructions may be placed in an instruction queue and subsequently decoded by the instruction decoder 58.

The data address generator 22 may include loop buffers 70 and adders 72 for data address generation in program loops. Virtual addresses are translated to physical addresses in data address generator 22. Data address generator 22 may also include a P register file 74, a future file 76, hazard detection circuitry 78 and a TLB 80.

Load/store unit 24 controls access to data cache 26 and memory 12. Load/store unit 24 may include a load buffer 90, a store buffer 92, a fill buffer 94 and a copyback buffer 96. The operations of the load/store unit 24 depend on instruction type, as described below. In the case of a microcontroller instruction or other instruction which requires access to data cache 26, the physical address is routed to data cache 26, the tag arrays of data cache 26 are accessed and the accessed data is output, as required by the instruction. Data cache controller 34 controls transfer of data between data cache 26 and memory 12. Instructions which do not require memory access may obtain operands from register file 28. In the case of a DSP instruction with memory access, the DSP instruction is placed in a skid buffer, and two memory accesses to memory 12 are initiated. Multiple DSP instructions can be placed in the skid buffer, and two memory accesses can be initiated on each cycle. The data from memory 12 is output to register file 28 for instruction execution. In a preferred embodiment, register file 28 has sixteen entries of 64 bits each and has four write ports and four read ports.

Microcontroller execution unit 30 may include an adder/subtractor 100, a shifter 102, circuitry 104 for logical operations and branch resolution circuitry 106. DSP execution unit 32 may include quad 32/64-bit multiplier/accumulators 110, a 32/64-bit ALU 112, a 32/64-bit shifter 114, an accelerator 116 for high speed execution of specific instructions and result formatting circuitry. The results of the microcontroller execution unit 30 and the DSP execution unit 32 are written back to register file 28. The final results may be written from register file 28 to memory 12.

The computation core 10 preferably has a pipelined architecture. The pipelined architecture is a well-known architecture wherein the core includes series-connected stages that operate synchronously, and instruction execution is divided into a series of operations performed in successive pipeline stages in successive clock cycles. Thus, for example, a first stage may perform instruction fetch, a second stage may perform instruction decoding, a third stage may perform data address generation, a fourth stage may perform data memory access and a fifth stage may perform the specified computation. An advantage of the pipelined architecture is increased operating speed, since multiple instructions may be in process simultaneously, with different instructions being in different states of completion.

An embodiment of a pipeline architecture is described with reference to FIGS. 1 and 2. With respect to pipeline operation, data cache 26 may be considered as part of the load/store function. Similarly, register file 28 may be considered as part of the execution function. In one embodiment, instruction fetch unit 20 has seven stages IF1–IF7, data address generator 22 has three stages AC1–AC3, and the combination of load/store unit 24 and data cache 26 has three stages LS1–LS3. The combination of register file 28 and microcontroller execution unit 30 has three stages UC1–WB, and the combination of register file 28 and DSP execution unit 32 has eight stages UC1–EP0. In addition, memory 12 is pipelined and has 11 stages SR1–SR11 in this embodiment. The number of stages defines the number of clock cycles required for an instruction to be completed in a particular unit. However, as noted above, multiple instructions may be in various stages of completion simultaneously.

The memory of the digital signal processor may have a hierarchical organization. The instruction cache 50 and the data cache 26 are level 1 memories, and memory 12 is a level 2 memory. The level 1 memories are characterized by low latency and relatively small capacities. By contrast, level 2 memory 12 is characterized by high capacity and relatively high latency. In the event of a cache miss, the level 2 memory is accessed.

Memory 12 is functionally connected to load/store unit 24 for processing load and store requests in connection with program execution. Memory 12 is also connected via data cache controller 34 to data cache 26 for transferring data to and from data cache 26 and is connected via an instruction cache controller to instruction cache 50 for transferring data to and from instruction cache 50. Accessed data is loaded from memory 12 to register file 28, and results are written back from register file 28 to memory 12. Memory 12 may further include a DMA port for DMA transfers to and from an external source. Memory 12 is preferably pipelined for high speed operation and, in one example, has a capacity of 10 megabits.

As described below, DSP performance may be enhanced by controlling operation such that certain instruction types access data cache 26, whereas other instruction types directly access level 2 memory 12 without first accessing data cache 26. Instruction types that access data cache 26 are typically used in program segments where data access is characterized by temporal and/or spatial locality. Such program segments are likely to benefit from the use of a data cache. Microcontroller instructions typically fall into this category. Instruction types that directly access level 2 memory 12 are typically used in program segments where data access is not characterized by temporal or spatial locality. Such program segments are unlikely to benefit from the use of a data cache. DSP instructions typically fall into this category. To achieve the desired performance, level 2 memory 12 is preferably capable of high speed operation and may be pipelined. Further, level 2 memory 12 may be configured to provide two or more data words per cycle, since DSP instructions may require two or more operands. In one embodiment, data cache 26 has a capacity of 16 k bytes, and level 2 memory 12 has a capacity of 10 megabits.

As indicated above, a memory hierarchy is utilized. In particular, data cache 26 serves as a level 1 memory, and memory 12 serves as a level 2 data memory. As known in the art, higher levels in the memory hierarchy typically are characterized by low latency and low capacity. In the embodiment of FIG. 1, data cache 26 accesses level 2 memory 12 in the case of a cache miss. However, DSP instructions requiring memory access do not access the data cache 26 and thus do not incur the overhead associated with a cache miss. Instead, DSP instructions requiring memory access directly access level 2 memory 12. The latency otherwise associated with lower level memories is avoided by configuring level 2 memory 12 as a highly pipelined memory that is capable of providing two data items per cycle. In particular, on every cycle two memory accesses can be started and two data items can be provided to DSP execution unit 32. So far as the programmer is concerned, two 64-bit data items are being received by DSP execution unit 32 on every cycle.

Figure 3:
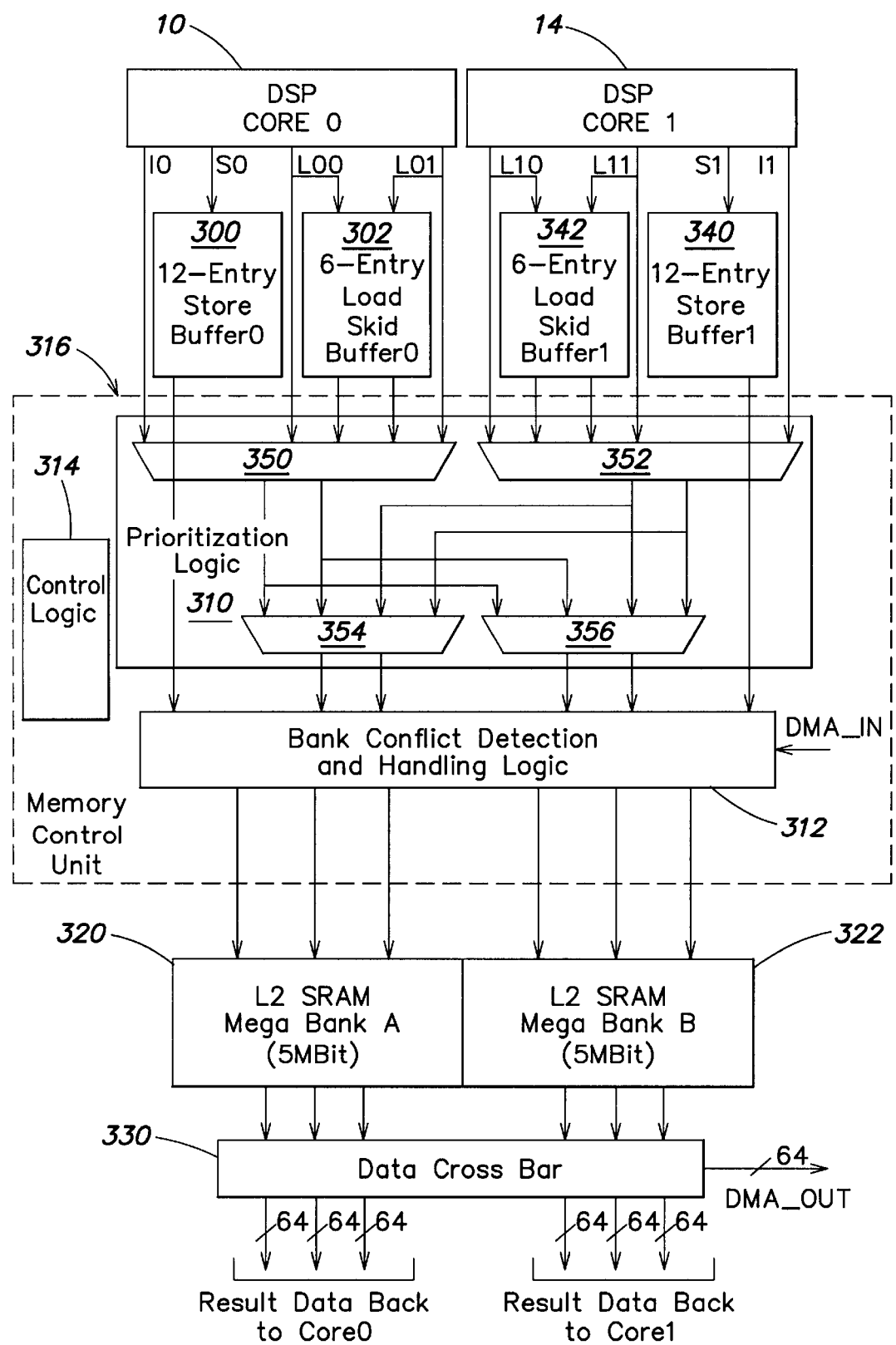
FIG. 3 is a schematic block diagram of a memory system in accordance with an embodiment of the invention.

A block diagram of an embodiment of level 2 memory 12 is shown in FIG. 3. In the embodiment of FIG. 3, memory 12 may be accessed by DSP core 10 and a second DSP core 14. However, it will be understood that memory 12 may operate with a single DSP core, such as DSP core 10. Furthermore, memory 12 may operate with processors other than DSP core 10 and with other DSP core configurations. For example, the DSP does not necessarily include separate DSP and microcontroller execution units.

DSP core 10 communicates with memory 12 via load buses L00 and L01, a store bus S0 and an instruction bus I0. Memory 12 includes a store buffer 300, a load skid buffer 302, prioritization logic 310, bank conflict detection and handling logic 312, control logic 314, SRAM megabanks 320 and 322 and a data crossbar 330. Prioritization logic 310, bank conflict detection and handling logic 312 and control logic 314 constitute a memory control unit 316. In the case where the memory 12 operates with DSP core 14, memory 12 further includes a store buffer 340 and a load skid buffer 342.

Load buses L00 and L01 are coupled to prioritization logic 310 and to load skid buffer 302. Load skid buffer 302 provides buffering of load requests in the event that the pipeline is stalled. The store bus S0 is coupled through store buffer 300 to bank conflict detection and handling logic 312. Instruction bus I0 is coupled to prioritization logic 310.

Prioritization logic 310 prioritizes memory access requests according to priorities that are predetermined or are programmable. In one embodiment, a DMA request has highest priority, a load from skid buffer 302 has second priority, a load from DSP core 10 has third priority, an instruction request from DSP core 10 has fourth priority and a store request has lowest priority. It will be understood that different priorities may be utilized to achieve a desired result.

As shown in FIG. 3, prioritization logic 310 includes muxes 350, 352, 354 and 356. Mux 350 selects two buses from load buses L00 and L01, instruction bus I0 and the two output buses of load skid buffer 302. Mux 352 selects two buses from load buses L10 and L11, instruction bus I1 and the two output buses of load skid buffer 342. Mux 354 selects the two output buses of mux 350 or the two output buses of mux 352. Similarly, mux 356 selects the two output buses of mux 350 or the two output buses of mux 352.

The bank conflict detection and handling logic 312 determines conflicts among memory access requests. In one embodiment, each of megabanks 320 and 322 includes five superbanks and can handle two load requests, one store request and one DMA request in parallel, provided that the access requests are addressed to different superbanks. In the event of a bank conflict, i.e. two access requests to the same superbank, the conflicting requests are pipelined one behind the other in the memory and a stall condition is generated. A stall signal is forwarded to the DSP core 10, whereby the DSP core 10 is notified to expect the result later.

In one embodiment, each of megabanks 320 and 322 has a size of 5 megabits, for a total memory size of 10 megabits, and can run at a clock frequency greater than 1 gigahertz. Each megabank includes five superbanks, each having a size of 1 megabits, so that multiple access requests can be serviced simultaneously by different superbanks. This permits two load requests to be started on each cycle and two load results to be provided to register file 28 on each cycle. Thus, two 64-bit load results can be obtained on each cycle. Data crossbar 330 routes data from megabanks 320 and 322 to DSP core 10, DSP core 14 and a DMA requestor in accordance with control signals derived from the instruction being executed.

Figure 4:
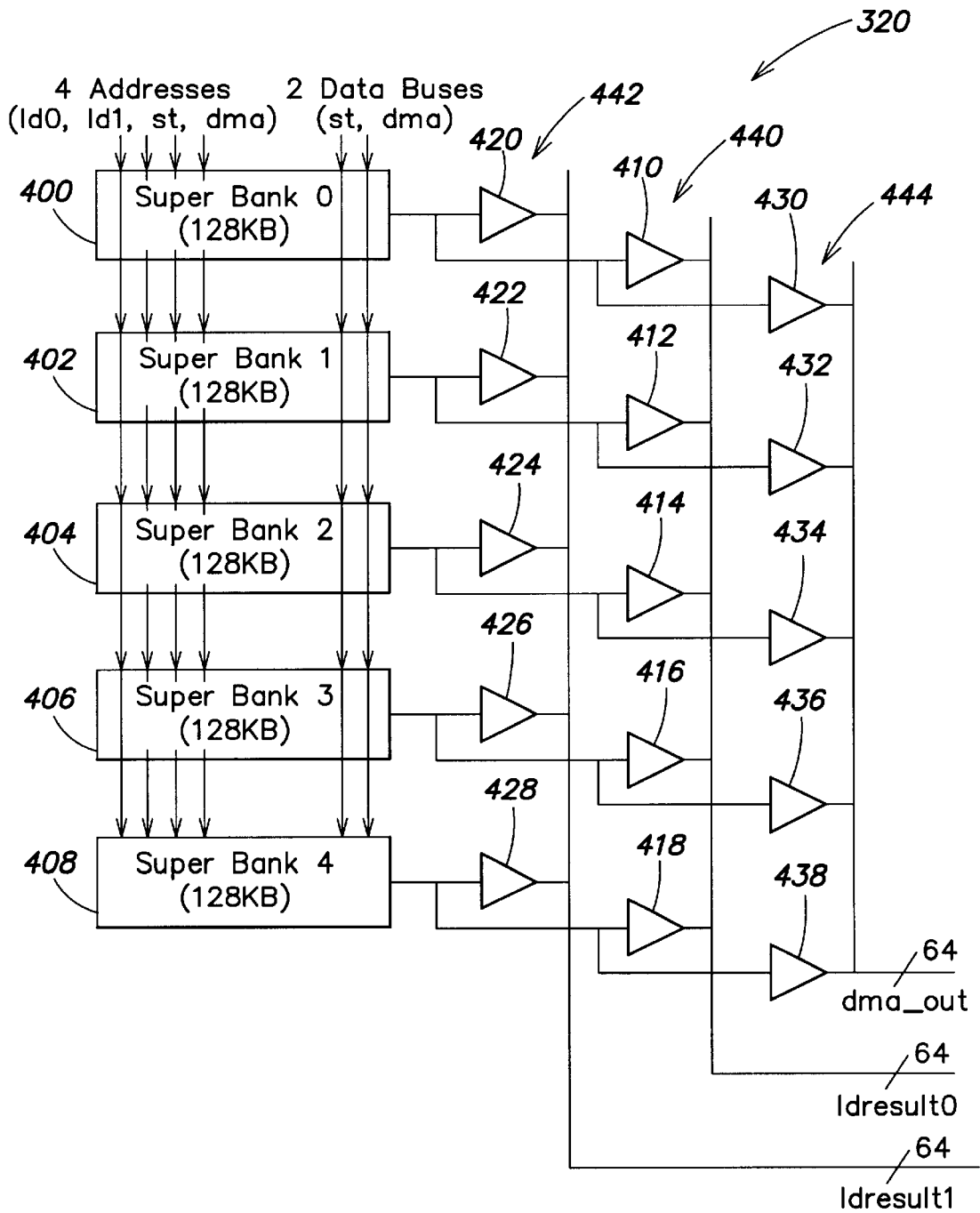
FIG. 4 is a schematic block diagram of an embodiment of a megabank shown in FIG. 3.

A block diagram of an embodiment of megabank 320 is shown in FIG. 4. Megabank 322 (FIG. 3) may have the same configuration. In the embodiment of FIG. 4, megabank 320 includes five super-banks 400, 402, 404, 406 and 408. Each super-bank preferably has a capacity of 128 k bytes, or 1 megabit. The megabank can service multiple accesses simultaneously, provided that the accesses are to different super-banks. The granularity of the parallel accesses is limited to the super-bank level in the embodiment of FIG. 4. As shown in FIG. 4, each super-bank is coupled to four address buses, including load address bus 1d0, load address bus 1d1, store address bus st and DMA address bus dma. Each super-bank is also coupled to two input data buses, including a store data bus st and a DMA data bus dma. The data outputs of super-banks 400, 402, 404, 406 and 408 are coupled through gated buffers 410, 412, 414, 416 and 418, respectively, to a load result bus 1dresult0 and are coupled through gated buffers 420, 422, 424, 426 and 428, respectively, to a load result bus 1dresult1. In addition, the outputs of super-banks 400, 402, 404, 406 and 408 are coupled through gated buffers 430, 432, 434, 436 and 438, respectively, to a DMA bus dma_out. Gated buffers 410, 412, 414, 416 and 418 constitute a first 5:1 mux 440, gated buffers 420, 422, 424, 426 and 428 constitute a second 5:1 mux 442, and gated buffers 430, 432, 434, 436 and 438 constitute a third 5:1 mux 444. The muxes 440, 442 and 444 are controlled by appropriate address bits to provide two load results and one DMA read result per clock cycle. The output data buses in the embodiment of FIG. 4 are 64 bits wide.

The megabank can support up to four simultaneous accesses, including two DSP core reads, one DSP core store and one DMA read/write. The two DSP core reads can be either two data memory accesses or one instruction memory access and one data memory access.

Figure 5:
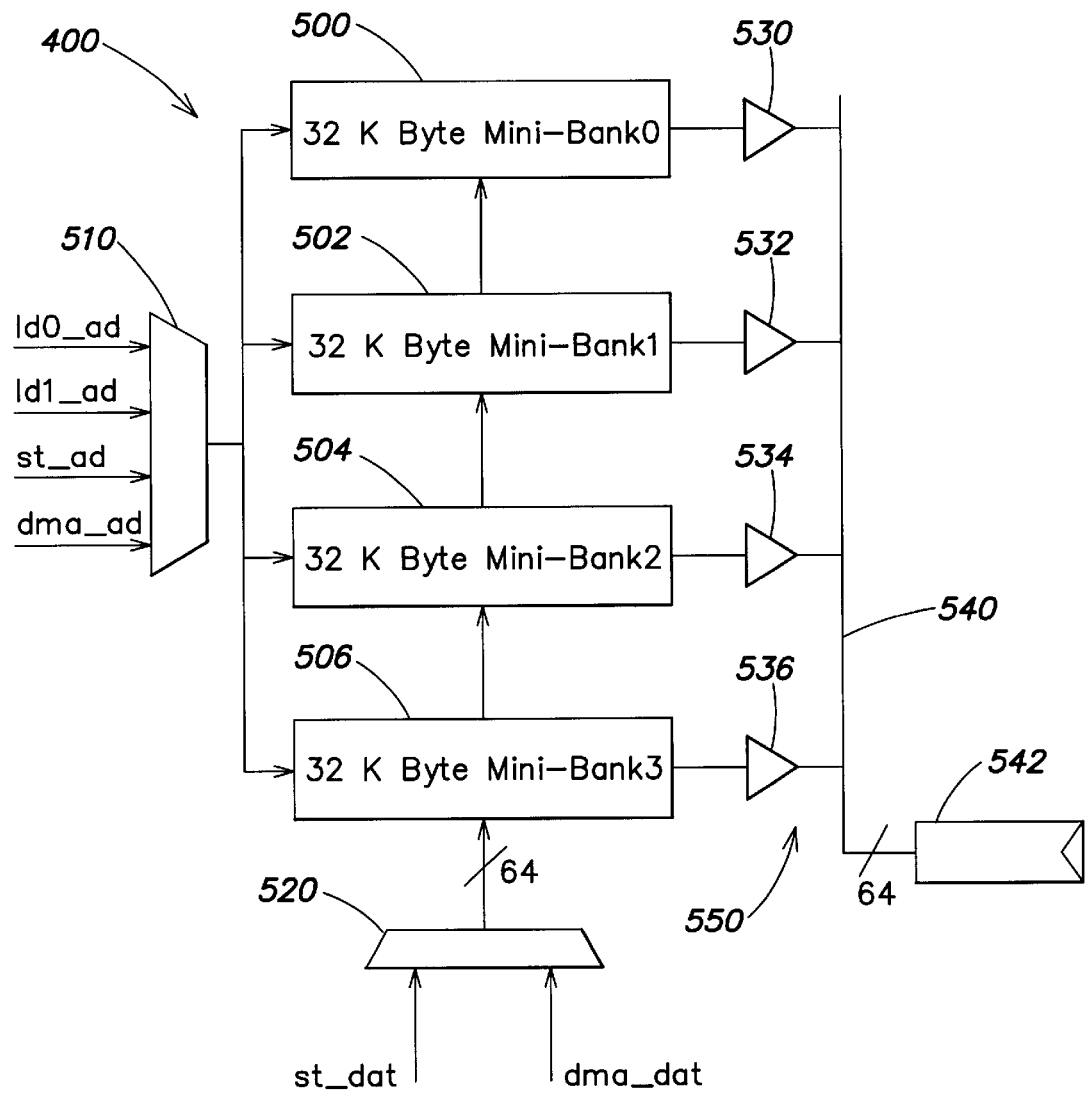
FIG. 5 is a schematic block diagram of an embodiment of a super-bank shown in FIG. 4.

A block diagram of an embodiment of super-bank 400 is shown in FIG. 5. Super-banks 402, 404, 406 and 408 (FIG. 4) may have the same configuration. Super-bank 400 may include mini-banks 500, 502, 504 and 506, each having a capacity of 32 k bytes. A mux 510 selects one of the address buses 1d0, 1d1, st or dma. The selected address bus is coupled to mini-banks 500, 502, 504 and 506. In a store operation or a DMA write operation, a mux 520 selects one of the input data buses st or dma, and the selected input data bus is coupled to mini-banks 500, 502, 504 and 506. The data outputs of mini-banks 500, 502, 504 and 506 are supplied through gated buffers 530, 532, 534 and 536, respectively, to a data bus 540. Gated buffers 530, 532, 534 and 536 constitute a 4:1 mux 550, which is controlled by appropriate address bits. Bus 540 is coupled to a register 542.

Figure 6:
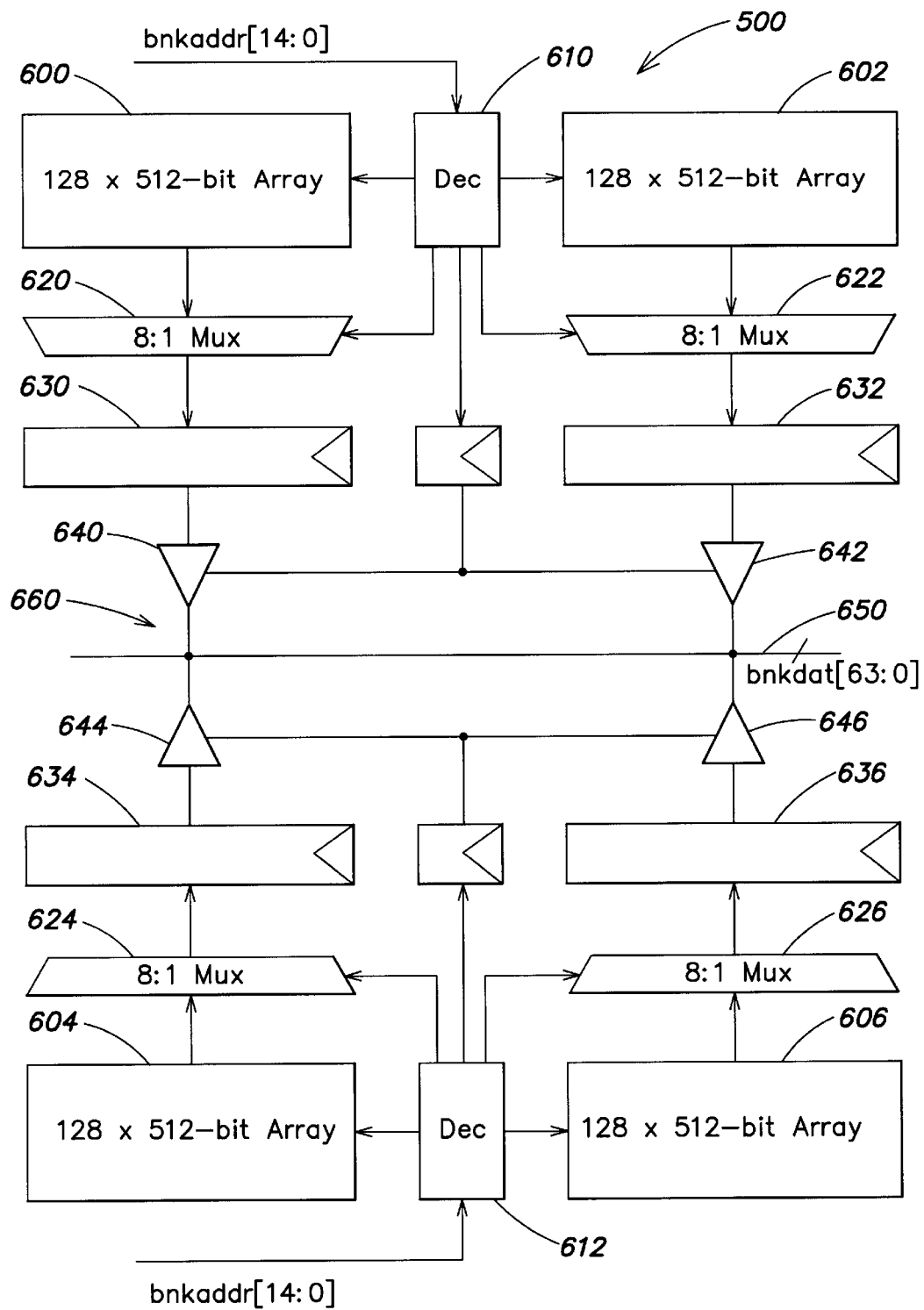
FIG. 6 is a schematic block diagram of an embodiment of a mini-bank shown in FIG. 5.

A block diagram of an embodiment of mini-bank 500 is shown in FIG. 6. Mini-banks 502, 504 and 506 (FIG. 5) may have the same configuration. As shown in FIG. 6, each mini-bank may have four quadrants, each of which includes an SRAM memory array. Thus, mini-bank 500 includes SRAM memory arrays 600, 602, 604 and 606, each of which is 128 bits by 512 bits in this embodiment. The bank address is supplied to address decoders 610 and 612. Outputs of address decoder 610 are supplied to memory arrays 600 and 602, and outputs of address decoder 612 are supplied to memory arrays 604 and 606. The outputs of memory arrays 600, 602, 604 and 606 are supplied to 8:1 muxes 620, 622, 624 and 626, respectively. Muxes 620 and 622 are controlled by outputs of address decoder 610, and muxes 624 and 626 are controlled by outputs of address decoder 612. Muxes 620, 622, 624 and 626 perform read column select of the respective memory arrays. The outputs of muxes 620, 622, 624 and 626 are supplied to registers 630, 632, 634 and 636, respectively. The outputs of registers 630, 632, 634 and 636 are coupled through gated buffers 640, 642, 644 and 646, respectively, to data bus 650. Gated buffers 640 and 642 are controlled by outputs of address decoder 610, and gated buffers 644 and 646 are controlled by outputs of address decoder 612. Gated buffers 640, 642, 644 and 646 constitute a 4:1 mux 660 for selection of a 64-bit result.

Figure 7A:
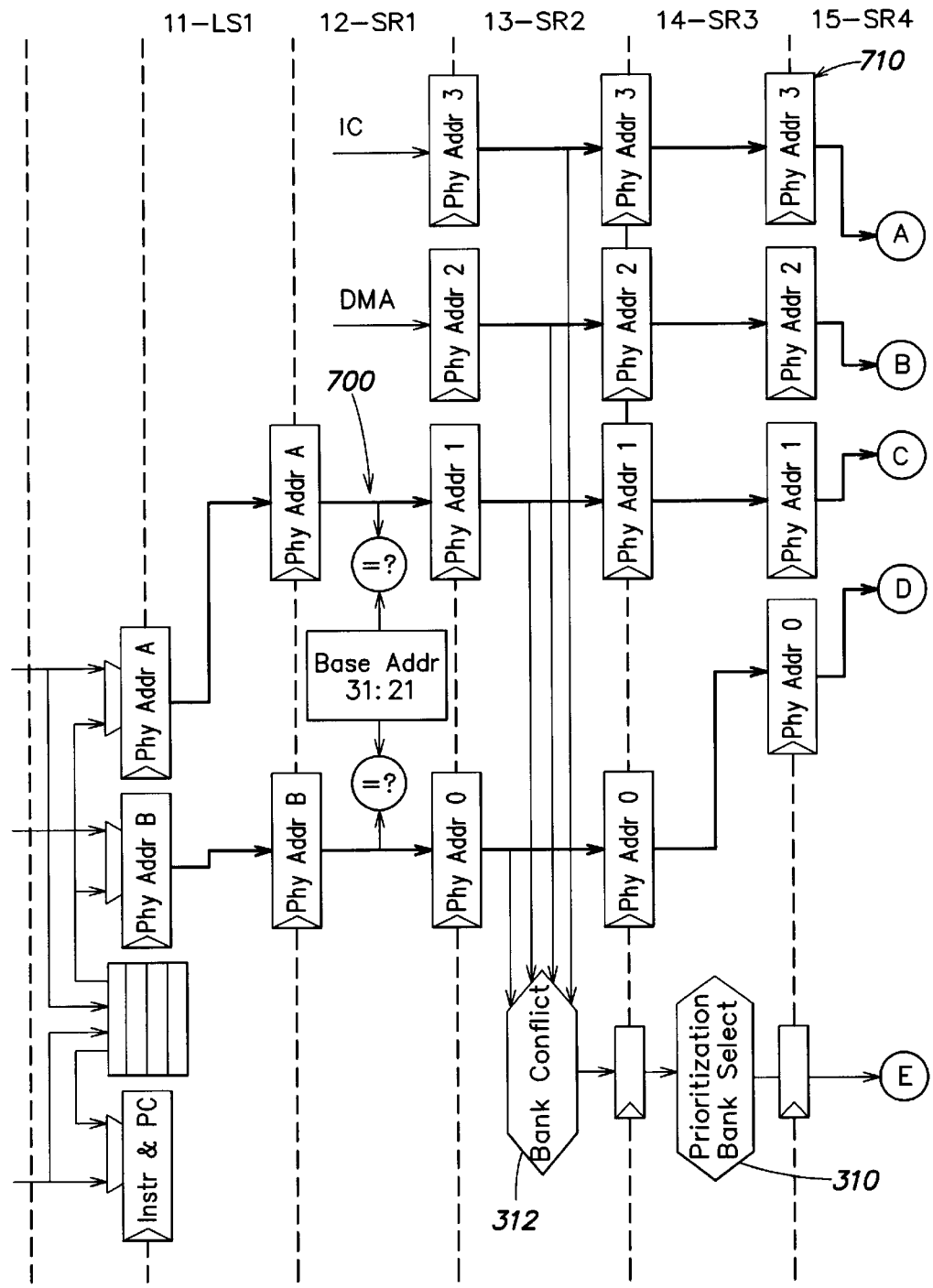
FIG. 7 is a schematic diagram that illustrates a pipeline configuration of the memory system in accordance with an embodiment of the invention.
Figure 7B:
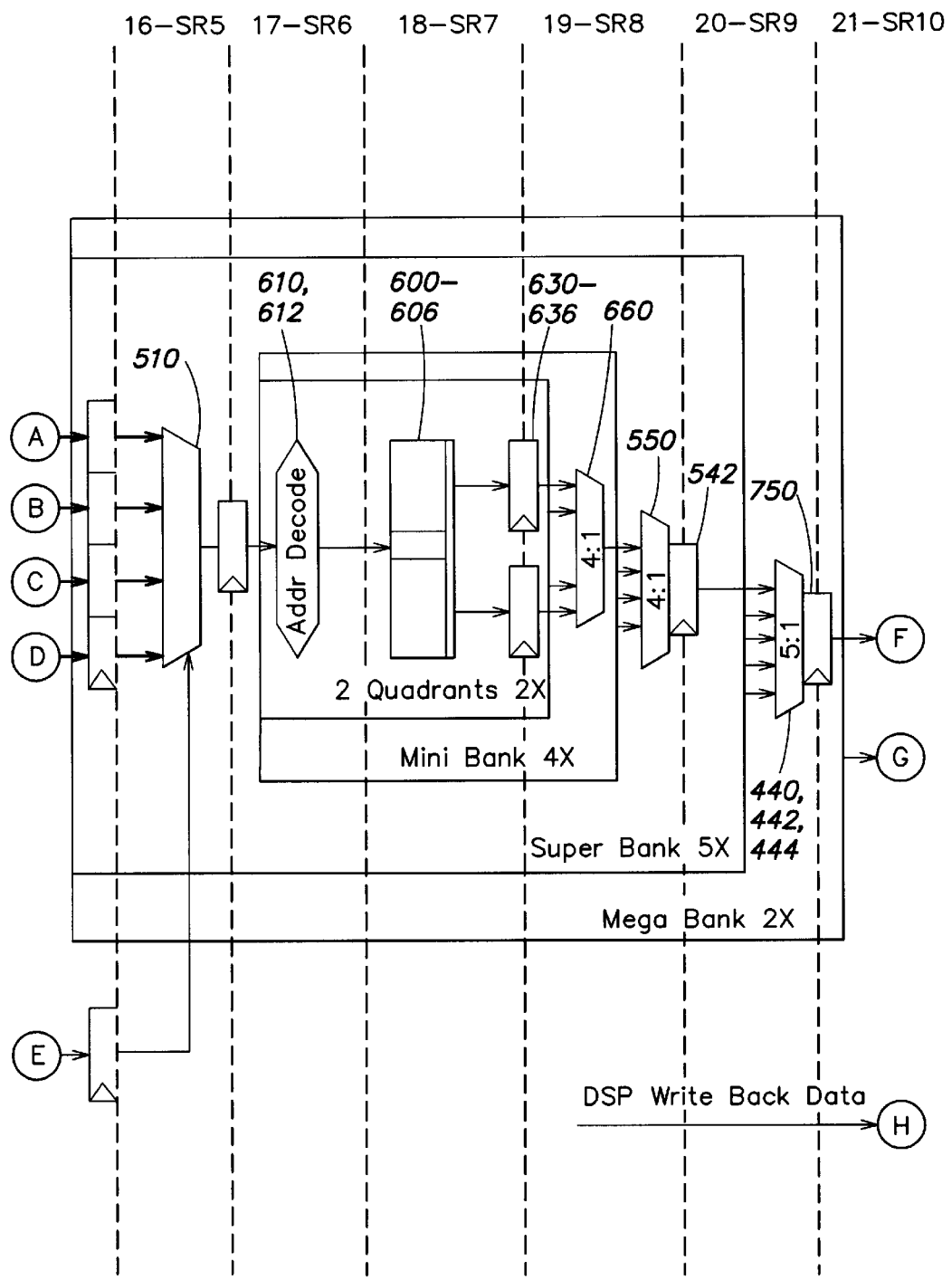
Figure 7C:
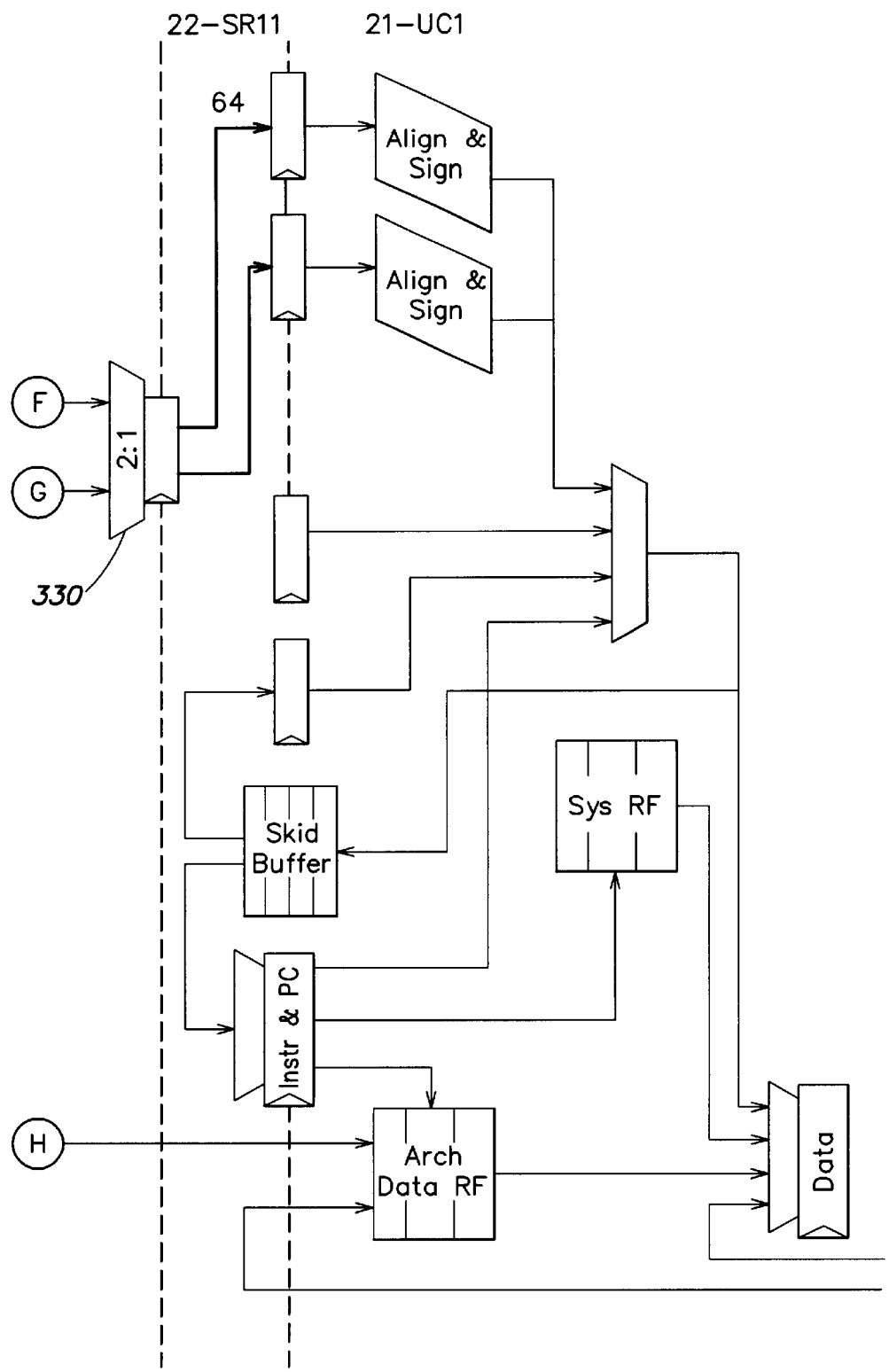

As noted above, level 2 memory 12 preferably has a pipeline configuration. A schematic diagram of an embodiment of a pipeline configuration of memory 12 is shown in FIG. 7. Like elements in FIGS. 3–7 have the same reference numerals. In the embodiment of FIG. 7, memory 12 has eleven stages and thus requires eleven cycles to service a load request. However, the eleven stage pipeline may process eleven access requests simultaneously and may supply two load results per clock cycle to register file 28 (FIG. 1).

The memory access is initiated in the LS1 stage of load/store unit 24 (FIG. 2). Memory 12 includes stages SR1 through SR11. Stage SR1 involves routing delay to the edge of memory 12 and SRAM base address compare 700 (FIG. 7). Stage SR2 involves prioritization of requests and bank address decode. Stage SR3 involves bank conflict detection, bank select generation and address and control signals present in registers 710 at the edge of the megabank. Stage SR4 involves address routing to all the superbanks.

Stage SR5 involves delay through the 4:1 address mux 510 at the edge of the superbank for selection of 1d0, 1d1, st or dma address buses and address routing to minibanks within the superbanks. Stage SR6 involves row address decoding by address decoders 610 and 612 (FIG. 6) and generation of quadrant enable. Stage SR7 involves reading memory arrays 600–606, read column multiplexing by muxes 620–626 and data present in registers 630–636 at the edge of the quadrant. Stage SR8 involves quadrant multiplexing by mux 660, minibank multiplexing by mux 550 and routing data across minibanks. Data is present in register 542 at the edge of the superbank. Stage SR9 involves routing across the five superbanks, superbank multiplexing by muxes 440, 442 and 444, and data present in register 750 at the edge of the megabank. Stage SR10 involves routing across the two minibanks and megabank multiplexing by data crossbar 330 (FIG. 3). Stage SR11 involves transport to the edge of the DSP core 10.

Data is multiplexed to the register file 28 in stage UC1. The corresponding instruction is read out of a skid buffer, which may be located in load/store unit 24, during stage SR8 and is advanced through stages LS1, LS2 and LS3 of load/store unit 24 simultaneously with the load request being advanced through stages SR9, SR10 and SR11, respectively, of memory 12. Thus, the corresponding instruction reaches the DSP execution unit 32 when the accessed data is present in register file 28.

When a stall condition is detected in systems that run at high frequencies, several clock cycles may be required for different pipeline units to react to the stall condition. The DSP core continues to initiate memory accesses every clock cycle. If a stall condition, such as a bank conflict condition, occurs in the memory, the DSP core continues to send access requests down the pipeline until the stall signal reaches the DSP core and the DSP core has reacted to the stall signal. The access requests following the stall condition are placed in the respective load skid buffers 302 and 342 (FIG. 3). After the stall condition is no longer present, the access requests that were placed in the skid buffers 302 and 342 are output from the skid buffers to prioritization logic 310 and are processed. Thus, the skid buffers 302 and 342 permit the system to run at high clock frequencies.

All of the store requests by the DSP cores 10 and 14 are placed in store buffers 300 and 340, respectively. The outputs of store buffers 300 and 340 are supplied to bank conflict detection and handling logic 312. Bank conflict detection and handling logic 312 identifies conflicts between load access requests, DMA access requests and store access requests, and gives priority to load access requests and DMA access requests.

The store access requests are output from store buffers 300 and 340 when there is no conflict with other load or DMA access requests. Stalls due to conflicts with stores are eliminated by providing the store buffer. Store to load forwarding support out of the store buffers is also provided. This eliminates stalls on loads that are dependent on stores.

The memory 12 is deeply pipelined and thus has relatively high latency. However, when the DSP is performing a series of computations, the high latency does not degrade performance. The memory 12 operates at very high speed and completes two load requests per clock cycle. The deeply pipelined memory permits clock frequencies greater than one gigahertz to be utilized.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A memory system for operation with a processor, comprising:
    a high speed pipelined memory;
    a store buffer for holding store access requests from the processor;
    a load buffer for holding load access requests from the processor;
    prioritization logic for selecting access requests in accordance with a priority scheme; and
    bank conflict logic for detecting and handling conflicts between access requests, wherein said bank conflict logic is configured for receiving selected access requests from said prioritization logic, store access requests from said store buffer and DMA access requests from a DMA requestor.

2. A memory system as defined in claim 1, wherein said pipelined memory comprises at least two independently-accessible megabanks, each comprising at least two independently accessible super-banks.

3. A memory system as defined in claim 1, wherein said pipelined memory comprises two independently-accessible megabanks, each comprising five independently accessible super-banks.

4. A memory system as defined in claim 1, wherein said pipelined memory is configured to output two load results per clock cycle.

5. A memory system as defined in claim 1, wherein said pipelined memory is configured to output two load results and one DMA result per clock cycle.

6. A memory system as defined in claim 1, wherein said prioritization logic is configured for receiving load access requests from said load buffer, load access requests from the processor and instruction access requests from the processor.

7. A memory system as defined in claim 1, wherein said prioritization logic is configured for receiving access requests from two or more processors.

8. A memory system as defined in claim 1, further comprising a switching circuit for directing result data from said pipelined memory to selected destinations.

9. A memory system as defined in claim 1, further comprising means for forwarding a store data value from said store buffer to the processor when a load access request follows a store access request with the same memory address.

10. A memory system as defined in claim 1, configured for operation at a clock frequency greater than 1 gigahertz.

11. A method for operating a high speed memory with a processor, comprising the steps of:
    placing store access requests from the processor in a store buffer;
    detecting a conflict between a store access request and another type of access request; and
    processing each store access request held in the store buffer in the absence of a conflict with another type of access request, wherein the step of processing each store access request comprises processing load access requests and DMA access requests before conflicting store access requests.

12. A memory system for operation with a processor, comprising
    a high speed pipelined memory;
    a store buffer for holding store access requests from the processor;
    a load buffer for holding load access requests from the processor;
    prioritization logic for selecting access requests in accordance with a priority scheme;
and
    bank conflict logic for detecting and handling conflicts between access requests,
    wherein said pipelined memory includes two or more pipeline stages, said prioritization logic includes at least one pipeline stage and said bank conflict logic includes at least one pipeline stage.

* * * * *